United States Patent [19]
Chen

[11] Patent Number: 5,600,659
[45] Date of Patent: Feb. 4, 1997

[54] LOW COST SYMBOL ERROR CORRECTION CODING AND DECODING

[75] Inventor: Chin-Long Chen, Fishkill, N.Y.

[73] Assignee: International Business Machines Corporation, Armonk, N.Y.

[21] Appl. No.: 856,421

[22] Filed: Mar. 23, 1992

Related U.S. Application Data

[63] Continuation-in-part of Ser. No. 318,983, Mar. 6, 1989, abandoned.

[51] Int. Cl.$^6$ .................................................. H03M 13/00
[52] U.S. Cl. ......................................... 371/37.1; 371/38.1
[58] Field of Search ................................. 371/37.1, 38.1, 371/39.1, 40.1

[56] References Cited

U.S. PATENT DOCUMENTS

| | | | |
|---|---|---|---|
| 4,142,174 | 2/1979 | Chen et al. | 340/146.1 |
| 4,358,848 | 11/1982 | Patel | 371/38.1 |
| 4,512,020 | 4/1985 | Krol et al. | 371/37.1 |
| 4,633,472 | 12/1986 | Krol | 371/40.1 |
| 4,675,869 | 6/1987 | Driessen | 371/37.8 |
| 4,769,818 | 9/1988 | Mortimer | 371/70 |
| 4,777,635 | 10/1988 | Glover | 371/40 |
| 4,862,463 | 8/1989 | Chen | 371/40.1 |

OTHER PUBLICATIONS

"Error–Correcting Codes" by W. Wesley Peterson, MIT, 1961.
Symbol Error Correcting Codes by Chin–Long Chen, IEEE International Symposium on Information Theory Proceedings, Kobe Japan, Jun. 19–24, 1988.
"Error–Correcting Codes for Byte–Organized Memory Systems" by C. L. Chen, IEEE Translations on Information Theory vol. IT–32, No. 2, Mar. 1986, pp. 181–185.

Primary Examiner—Robert W. Beausoliel, Jr.
Assistant Examiner—Glenn Snyder
Attorney, Agent, or Firm—Lawrence D. Cutter

[57] ABSTRACT

Byte or symbol organized linear block codes are optimized in terms of reducing the number of ones in their parity check matrices by means of symbol column transformations carried out by multiplication by non-singular matrices. Each optimized symbol column preferably, and probably necessarily, includes a submatrix which is the identity matrix which contributes to low weight check matrices and also to simplified decoding procedures and apparatus. Since circuit cost and layout area are proportional to the number of Exclusive-OR gates which is determined by the number of ones in the check matrix, it is seen that the reduction procedures carried out in accordance with the present invention solve significant problems that are particularly applicable in the utilization of byte organized semiconductor memory systems. Reduced weight coding systems are also generated in accordance with weight reducing procedures used in conjunction with modified Reed Solomon codes. The decoding and encoding methods and apparatus are extendable to the inclusion of any number of check symbols.

3 Claims, 14 Drawing Sheets

FIG. 1A

$$H = \begin{bmatrix} I & I & I & I & I & I & I & I & I & I & I & I & I & I & I & 0 & 0 \\ I & T^2 & T^3 & T^4 & T^5 & T^6 & T^7 & T^8 & T^9 & T^{10} & T^{11} & T^{12} & T^{13} & T^{14} & 0 & I & 0 \\ I & T & T^3 & T^{29} & T^{28} & T^{27} & T^{26} & T^{25} & T^{24} & T^{23} & T^{22} & T^{21} & T^{20} & T^{19} & T^{18} & T^{17} & 0 & 0 & I \end{bmatrix}$$

FIG. 1B

$$T = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 1 & 0 & 0 \end{bmatrix}$$

FIG. 1C

$$H = \begin{bmatrix} I & I & I & - & - & - \\ I & T & T^2 & T^3 & - & - \\ I & T^{-1} & T^{-2} & T^{-3} & - & - \\ I & T^{-2} & T^{-4} & T^{-6} & - & - \end{bmatrix}$$

FIG. 2

$$H = \begin{bmatrix} I & I & I & I & I & I & T^{24} & T^{8} & T^{9} & T^{10} & T^{20} & T^{19} & T^{18} & T^{17} & I & 0 & 0 & 0 & 1 \\ I & T & T^{2} & T^{3} & T^{4} & T^{5} & T^{6} & I & T^{16} & T^{18} & T^{20} & I & I & I & 0 & I & I & 0 & 0 \\ I & T^{30} & T^{29} & T^{28} & T^{27} & T^{26} & T^{25} & T^{17} & I & T^{9} & T^{7} & T^{5} & T^{3} & I & I & 0 & 0 & I \end{bmatrix}$$

FIG. 3

$$H = \begin{bmatrix} T^{18} & T^{18} & I & I & I & I & I & T^{3} & T^{30} & T^{28} & I & T^{16} & 0 & T^{16} & I & T^{17} & I \\ I & T^{5} & T^{29} & T^{27} & T^{2} & T^{4} & T & T^{3} & T^{30} & T^{28} & I & 0 & I & I & T & T^{17} & I & T^{3} \\ T^{5} & I & T^{2} & T^{4} & T^{29} & T^{27} & T^{30} & T^{28} & T & T^{3} & 0 & I & I & I & I & 0 & I & T^{3} \end{bmatrix}$$

FIG. 4A BINARY MATRIX OF FIG. 3

FIG. 4B  BINARY MATRIX OF FIG. 3

| 10000 | 00000 | 11100 | 00000 | 11000 | 00000 | 10000 | 00000 | 00100 |
|-------|-------|-------|-------|-------|-------|-------|-------|-------|
| 01000 | 00000 | 11110 | 00000 | 11100 | 10000 | 01000 | 00000 | 00010 |
| 00100 | 00000 | 00011 | 00000 | 11101 | 01000 | 00100 | 00000 | 00101 |
| 00010 | 00000 | 10001 | 00000 | 01111 | 00100 | 00010 | 00000 | 10010 |
| 00001 | 00000 | 11000 | 00000 | 00111 | 00010 | 00001 | 00000 | 01001 |
|       |       |       |       |       |       |       |       |       |
| 01010 | 10000 | 00001 | 00000 | 10000 | 00001 | 00001 | 10000 | 00100 |
| 10101 | 01000 | 00000 | 10000 | 11000 | 00000 | 10000 | 01000 | 00010 |
| 10000 | 00100 | 00000 | 01000 | 10100 | 00000 | 01001 | 00100 | 00101 |
| 01000 | 00010 | 00000 | 00100 | 00010 | 00000 | 00100 | 00010 | 10010 |
| 10100 | 00001 | 00000 | 00010 | 00001 | 00000 | 00010 | 00001 | 01001 |
|       |       |       |       |       |       |       |       |       |
| 00100 | 00000 | 00001 | 10000 | 01000 | 10000 | 00100 | 00000 | 00100 |
| 00010 | 00000 | 00000 | 01000 | 01000 | 01000 | 00010 | 00000 | 00010 |
| 00101 | 00000 | 00000 | 10010 | 00101 | 00100 | 00101 | 00000 | 00101 |
| 10010 | 00000 | 00000 | 00100 | 10010 | 00010 | 10010 | 00000 | 10010 |
| 01001 | 00000 | 00000 | 00010 | 01001 | 00001 | 01001 | 00000 | 01001 |

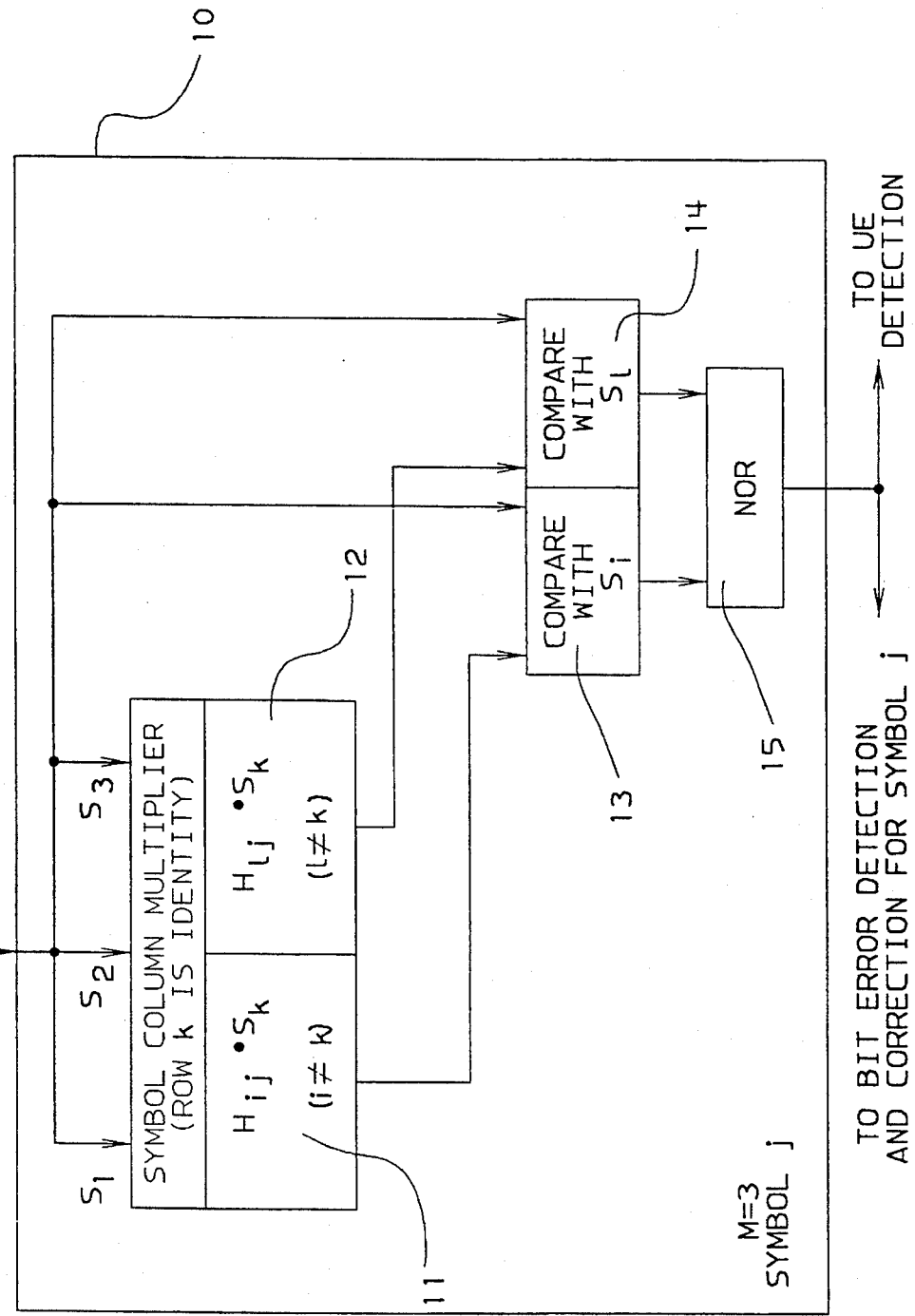

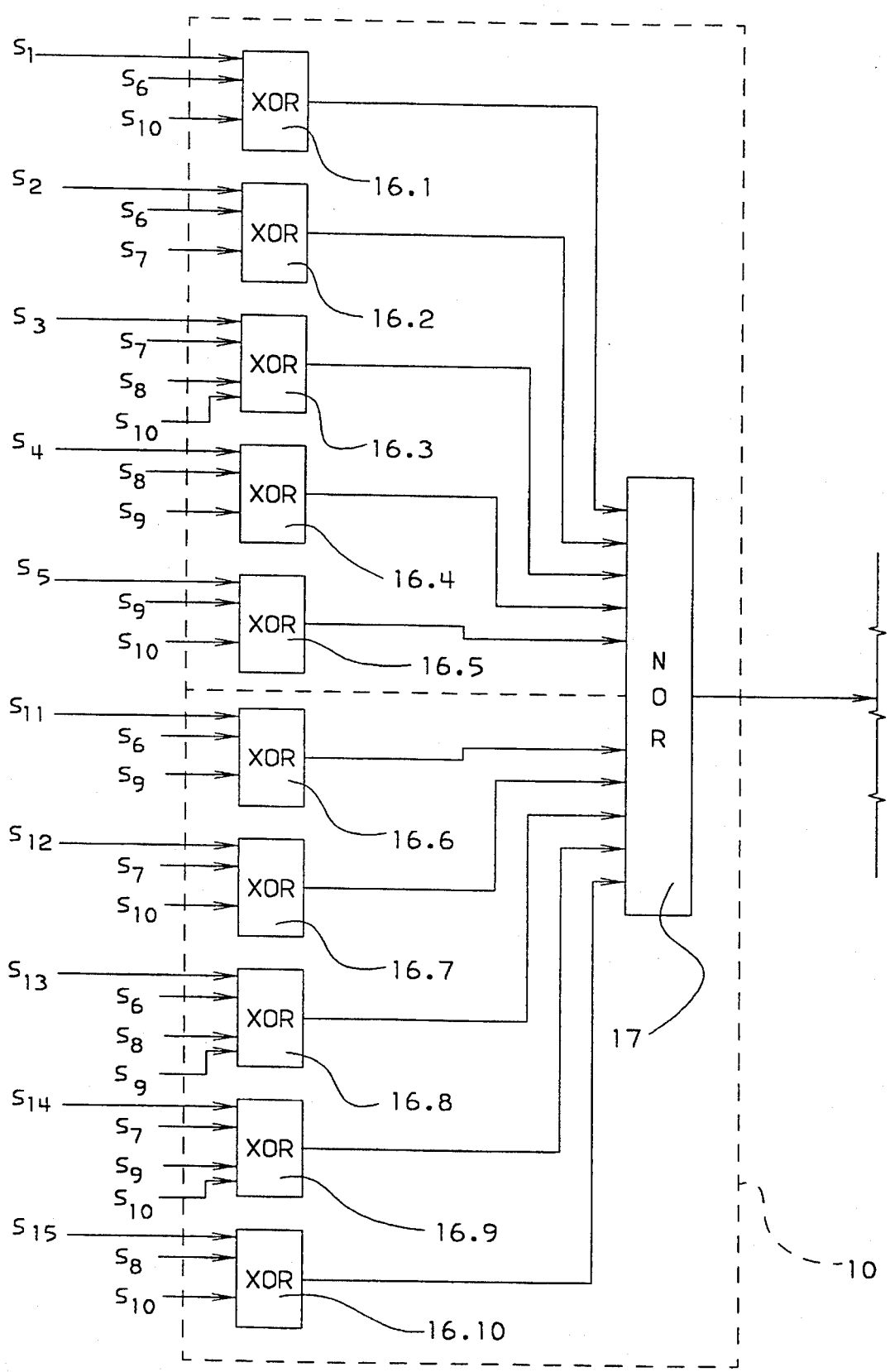
FIG.8A1

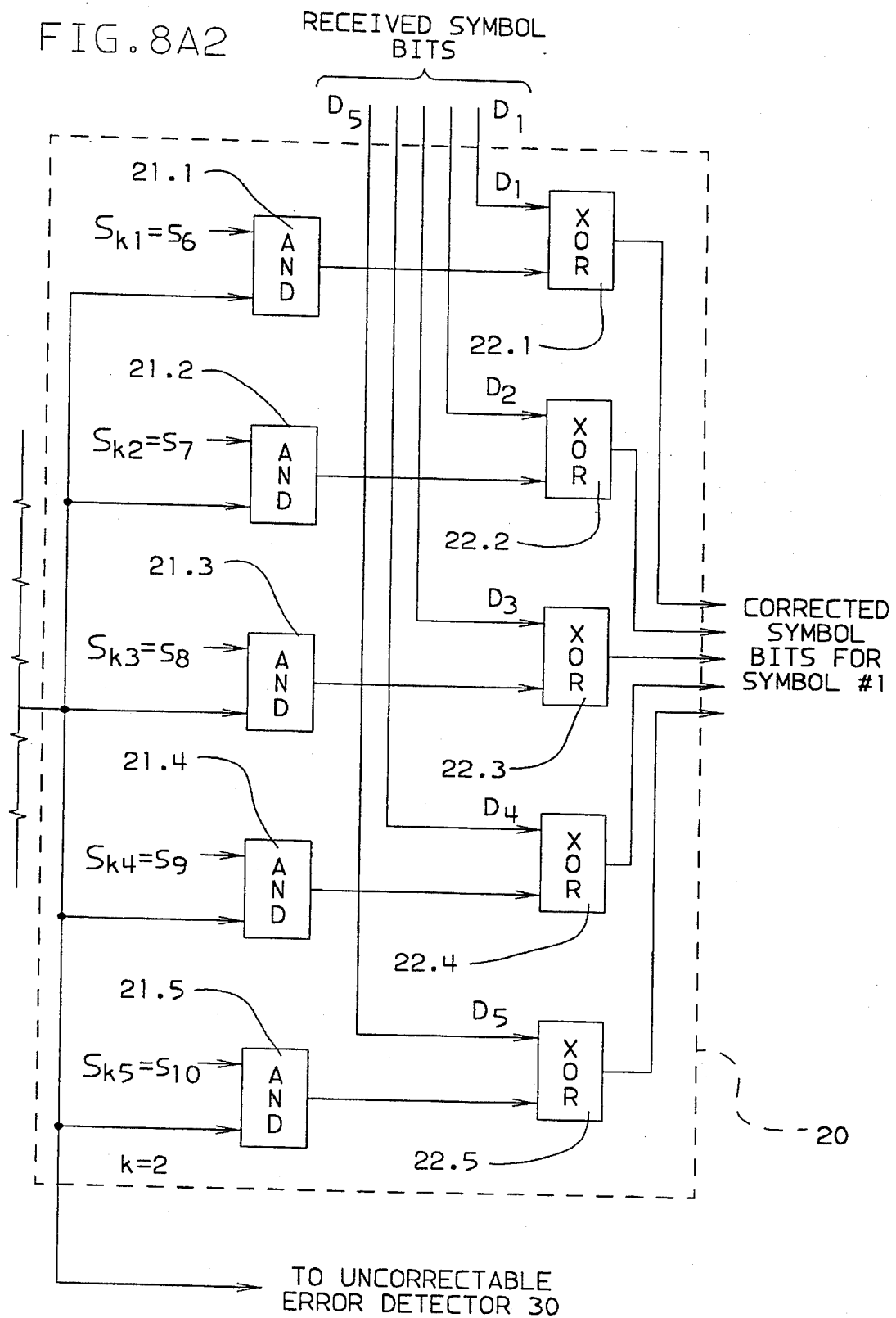

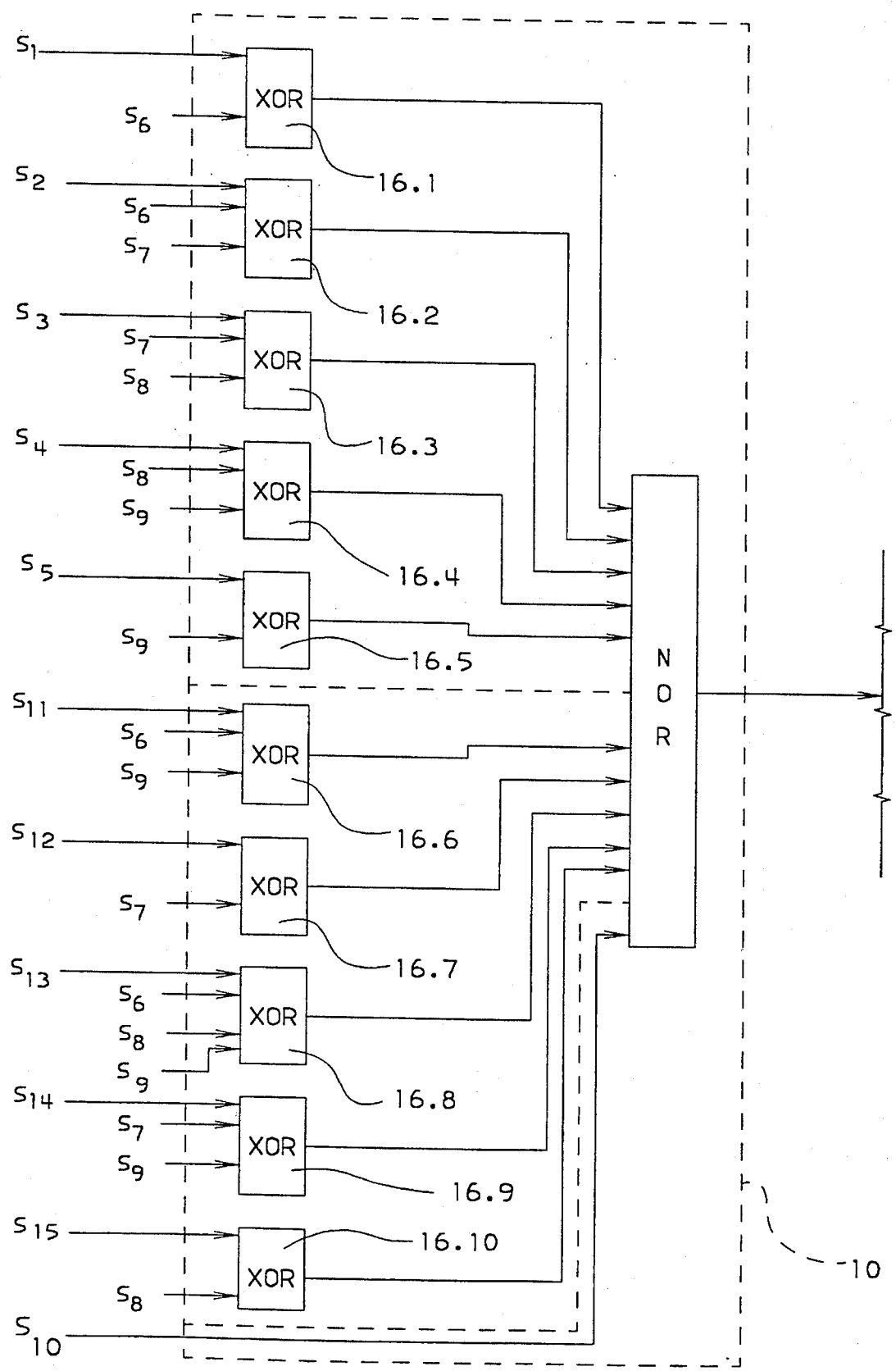
FIG.8B1

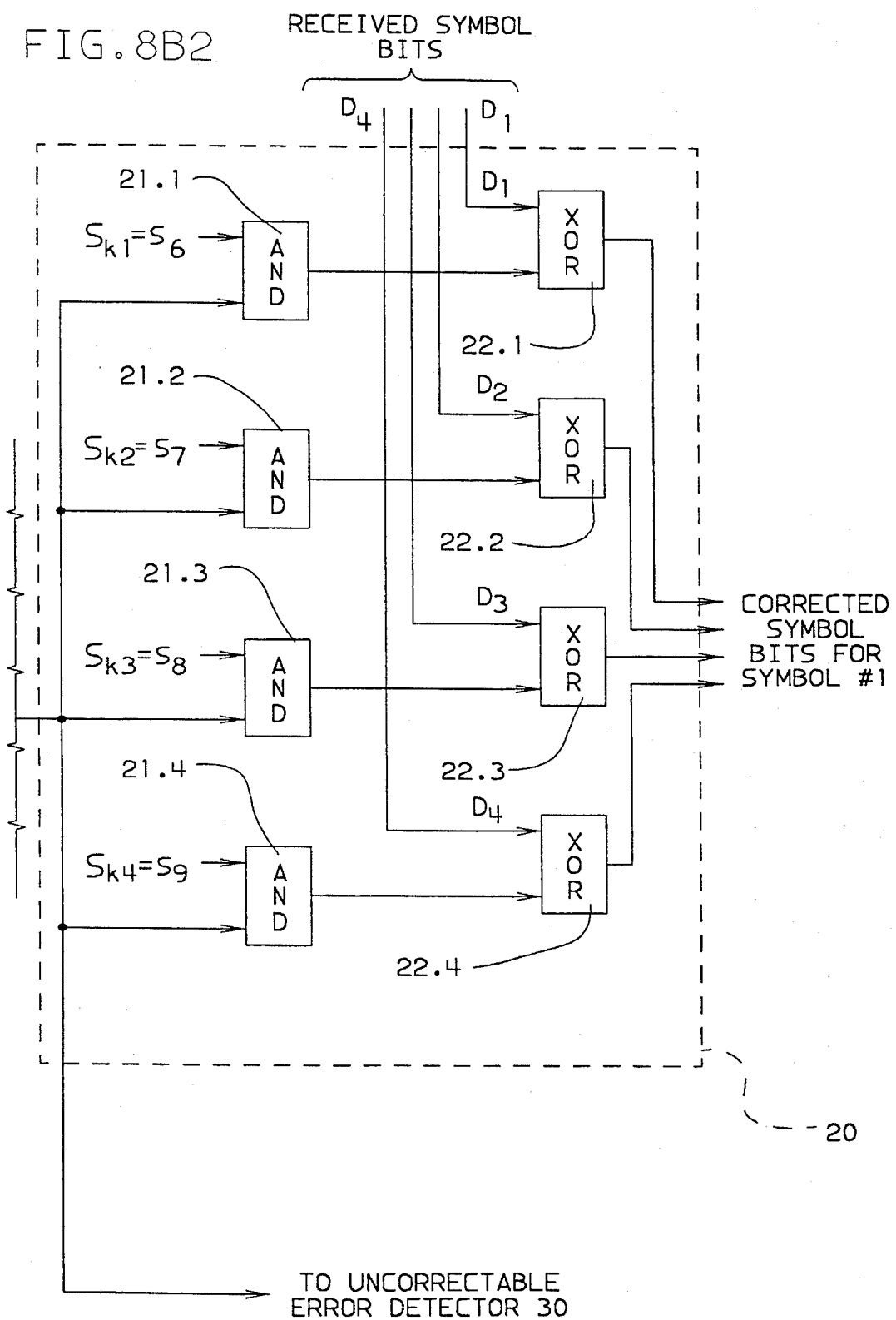
FIG. 8B2

LOW COST SYMBOL ERROR CORRECTION CODING AND DECODING

The following is a continuation-in-part of application Ser. No. 07/318,983 filed on Mar. 6, 1989, which is now abandoned.

BACKGROUND OF THE INVENTION

The present invention is generally directed to the encoding and decoding of binary data so as to employ error correction coding (ECC) methods for symbol error correction and detection. Apparatus for decoding such codes is also provided and implemented in a fashion which exploits code structure to provide encoders and decoders which minimize circuit cost, particularly with respect to the number of Exclusive-OR gates needed. More particularly, an embodiment employing three check symbols is presented.

The utilization of error correction and detection codes in electronic data processing and transmission systems is becoming more and more important for several reasons. In particular, increased problem complexity and security concerns require ever increasing levels of reliability in data transmission. Furthermore, the increased use of high density, very large scale integrated (VLSI) circuit chips for use in memory systems has increased the potential for the occurrence of soft errors such as those induced by alpha particle background radiation effects. Furthermore, the increased use of integrated circuit chips has led to memory organizations in which each output memory word is derived from multiple bit patterns received from a plurality of different circuit chips. Accordingly, it has become more desirable to be able to protect memory system integrity against the occurrence of chip failures since such failures produce multi-bit errors which are associated with a single chip. It is thus seen that it is desirable to employ error correction coding systems which take advantage of the memory system organization itself, particularly with respect to minimizing the probability of error. For this reason, it is desirable to employ codes which are based upon symbols or bytes of data. (It is noted that, as used herein, the term "byte" does not necessarily refer to an 8-bit block of binary data but rather is more generic.)

As noted, error correcting codes have been applied to semiconductor memory systems to increase reliability, reduce service costs and to maintain data integrity. In particular, single error correcting and double error detecting (SEC-DED) codes have been successfully applied to many computer memory systems. These codes have become an integral part of the memory design for medium and large systems throughout large portions of the computer industry.

However, the error control effectiveness of an error correction code depends on how the memory chips are organized with respect to the code. In the case of single error correcting and double error detecting codes, the one bit per chip organization is the most effective design. In this organization, each bit of a code word is stored in a different chip, thus any type of failure in a chip can corrupt at most one bit of the code word. As long as the errors do not line up in the same code word, multiple errors in the memory are correctable in this scheme.

As the trend in chip design has continued toward higher and higher density, it has become more difficult to design one bit per chip types of memory organizations because of the system granularity problem. For example, the system capacity has to be at least four megabits if one megabit chips are used to design a memory with a 32 bit data path. However, in a b bit per chip memory, a chip failure may result in from 1 to b bit errors, depending upon the type of failure. A failure could be a cell failure, a word line failure, a bit line failure, a partial chip failure or a total chip failure. With a maintenance strategy that allows correctable errors in the memory to accumulate, SEC-DED codes are not particularly suitable for b bit per chip memories. Since multiple bit errors are not correctable by SEC-DED codes, the uncorrectable error rates can be high if the distribution of chip failure types is skewed to those types that result in multiple bit errors.

A more serious problem is the loss of data integrity due to the miscorrection of some multiple errors. It is therefore seen that for byte organized memory systems, it is desirable to employ single byte error correcting and double byte error detecting (SBC-DBD) codes in b bit per chip memories. With such codes, errors generated by a single chip failure are always correctable and errors generated by a double chip failure are always detectable. Thus, the uncorrectable error rate can be kept low and the data integrity can be maintained. Discussions concerning codes that are suitable for this purpose can be found in the article "Error-Correcting Codes for Byte-Organized Memory Systems", by Chin-Long Chen in Volume IT-32, No. 2 of the IEEE Transactions on Information Theory (March 1986).

In the construction of error correcting codes contrary criteria are often present. The first criteria relates to the error correcting capabilities of the code itself. The second criteria relates to the ease of encoding and more particularly, of decoding the information received. More complex codes often require more complicated circuitry for decoding. With the constraints of electronic circuit chip "real estate" being at a premium with respect to circuit design, it is seen that it is greatly desirable to be able to implement both encoding and decoding circuits utilizing as few circuit gates as possible with each gate having a minimum number of attached signal lines. Accordingly, one of the objects of the present invention is the construction of minimum cost encoders and decoders without the corresponding sacrifice of correction and detection capabilities.

In particular, one of the classes of codes which is particularly applicable to the present invention is a code employing three check symbols. Such a code can be described as an extended Reed Solomon code having a parity check matrix of the form:

$$H = \begin{bmatrix} I & T^a & T^{2a} & T^{3a} & \ldots & I & O & O \\ I & T^{a+1} & T^{2(a+1)} & T^{3(a+1)} & \ldots & O & I & O \\ I & T^{a-1} & T^{2(a-1)} & T^{3(a-1)} & \ldots & O & O & I \end{bmatrix} \quad (1)$$

In Equation 1 above, H is the parity check matrix, a well known concept in error correction coding. I represents the identity matrix and O represents a matrix all of whose elements are zero. In general, T is a matrix with b rows and b columns and represents the companion matrix of a $b^{th}$ degree primitive polynomial over the field GF(2). In one particular embodiment of this form of Reed Solomon code, the integer a is taken to be zero. Further information concerning such codes is found in the aforementioned article by the present inventor.

SUMMARY OF THE INVENTION

In accordance with a preferred embodiment of the present invention, a method for encoding binary data which occurs in a block of n bits and subblocks of at most b symbol bits, comprises subjecting the n bits of data to parity check conditions determined by a binary parity check matrix which is either equal to or derivable from a matrix of the form $H=[H_1 \ H_2 \ \ldots \ H_N]$, where each symbol column $H_j$ is a column of M disjoint binary submatrices $H_{ij}$ having b rows and at most b columns and wherein at least one of the N symbol columns possesses a minimal number of ones. In particular, the present inventor has realized that the submatrices in each symbol column may be multiplied by non-singular binary matrices without affecting error correction or detection properties. Nonetheless at the same time the resultant code exhibits a reduction in the number of ones in the parity check matrix. It is seen that this is a desirable goal since the number of 2-way Exclusive-OR gates required to generate the $i^{th}$ check bit is equal to the number of ones in the $i^{th}$ row of the binary matrix H less one. Thus, in the situation in which each symbol possesses b bits, the total number of Exclusive-OR gates required to generate all check bits is equal to the number of ones in the binary matrix H–3b (for M=3), M being the number of check symbols. In addition, the number of ones in a symbol-column of H is proportional to the number of Exclusive-OR gates required to decode syndrome errors. Thus, to reduce error correction encoding and decoding hardware, it is seen it is desirable to reduce the number of ones in each symbol-column, $H_j$.

Thus, in accordance with the present invention it is possible to manipulate symbol columns of H through the utilization of multiplication by non-singular matrices which thus create equivalent codes. While multiplication of the H matrix itself is known to effect the creation of equivalent codes having identical error correction and detection capabilities, this method does not appear to have been applied to symbol columns in the parity check matrices of byte organized codes.

In the process of symbol column manipulation taught by the present invention, it is further desired to carry out non-singular transformations for symbol columns independently of one another in such a way that one of the M disjoint binary submatrices which comprise column $H_j$ is an identity matrix. It is not known, but it is suspected, that it is a necessary condition for minimally that at least one of the M disjoint submatrices is in fact an identity matrix. It is clearly seen that this is a desirable goal in that an identity matrix itself possesses a minimal number of ones and cannot in fact possess fewer ones without a reduction in rank. Thus, in accordance with preferred embodiments of the present invention, the symbol columns in the parity check matrices all possess at least one identity submatrix. Furthermore, it is seen that this situation is always possible to create, particularly with respect to the situation involving Reed Solomon codes. The constraint of having an identity matrix present further simplifies the design of decoding circuitry. Although each symbol decoding unit must be designed separately, nonetheless, there is a decided saving in the number of Exclusive-OR gates required, sometimes resulting in a reduction in circuitry by as much as approximately 25%. Furthermore, the separate design requirement is only a factor during code design and does not affect coding or decoding cost or speed.

In accordance with yet another embodiment of the present invention, a method for decoding linear binary codes of the kind indicated above comprises the steps of determining a syndrome vector S for a received binary vector y with the syndrome S being treated as having M subvectors $S_1, S_2, \ldots, S_M$. Then, for at least one symbol position j the (M–1) matrix-vector products $H_{ij} \cdot S_k$ (i≠k) are determined. In the above, k denotes the matrix row of $H_j$ which is an identity matrix. The value of k depends on j and varies from symbol column to symbol column. The (M–1) vector products are then compared with the corresponding syndrome vectors $S_i$ to determine the presence or absence of correctable symbol errors. Lastly, at least the $j^{th}$ symbol is corrected using the vector pattern $S_k$ as an error pattern whenever an the indication of a correctable symbol error arises from the comparison operation. A corresponding apparatus for decoding such linear binary codes is also presented herein.

Accordingly, it is an object of the present invention to permit the design of parity check matrices having a minimal weight, that is having a minimal number of 1's in their structure.

It is also an object of the present invention to extend the applicability of at least a subset of Reed Solomon codes.

It is yet another object of the present invention to construct error correcting codes and encoding apparatus which consume minimal amounts of circuitry, particularly as measured with respect to area consumed on VLSI circuit chips.

It is a still further object of the present invention to construct decoding apparatus in which the aforementioned matrix-vector product operations and comparison operations are carried out in a single layer of Exclusive-OR gates.

It is also an object of the present invention to construct codes, encoders and decoding systems which are particularly applicable to byte organized memory systems without in any way impairing the error correction or detection capabilities of such codes.

It is yet another object of the present invention to be able to construct codes which are derivable from minimal weight codes so as to further simplify coder and decoder design and implementation.

Lastly, but not limited hereto, it is an object of the present invention to implement low cost error correcting codes which enhance computer storage integrity, reliability and serviceability.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 1A illustrates a matrix for a byte organized code having three check symbols and which is illustrative of the kinds of parity check matrices which may be manipulated and processed in accordance with the present invention for the purpose of circuit and decoder simplification;

FIG. 1B illustrates a matrix T which is the companion matrix for a specific primitive polynomial p(x) which is used herein in an exemplary manner and which may be substituted in the matrix of FIG. 1A;

FIG. 1C illustrates a parity check matrix of a more general form exhibiting in particular a larger number of check symbols and further illustrating the extension of such parity check matrices to codes employing a higher number of check symbols;

FIG. 2 illustrates a parity check matrix which has been manipulated in accordance with the present invention;

FIG. 3 illustrates a parity check matrix constructed in accordance with one embodiment of the present invention in which one initially employs a longer length code with a greater number of symbols and selectively reduces symbol columns from the larger parity check matrix in accordance with the requirements of minimal weight;

FIG. 4 (in parts A and B) is the binary matrix representation of the parity check matrix shown in matrix form in FIG. 3;

FIG. 6C illustrates the organization of multiplication and comparison circuitry for the particular case of symbol j and the presence of M=3 check symbols;

FIG. 8A (in parts A1 and A2) illustrates the particular circuitry employed to implement the matrix vector product and comparison operations performed for symbol j=1 for the matrix shown in FIG. 4;

FIG. 8B (in parts B1 and B2) is similar to FIG. 8A but is more particularly directed to the reduced parity check matrix seen in FIG. 7.

DETAILED DESCRIPTION OF THE INVENTION

Figure 5:
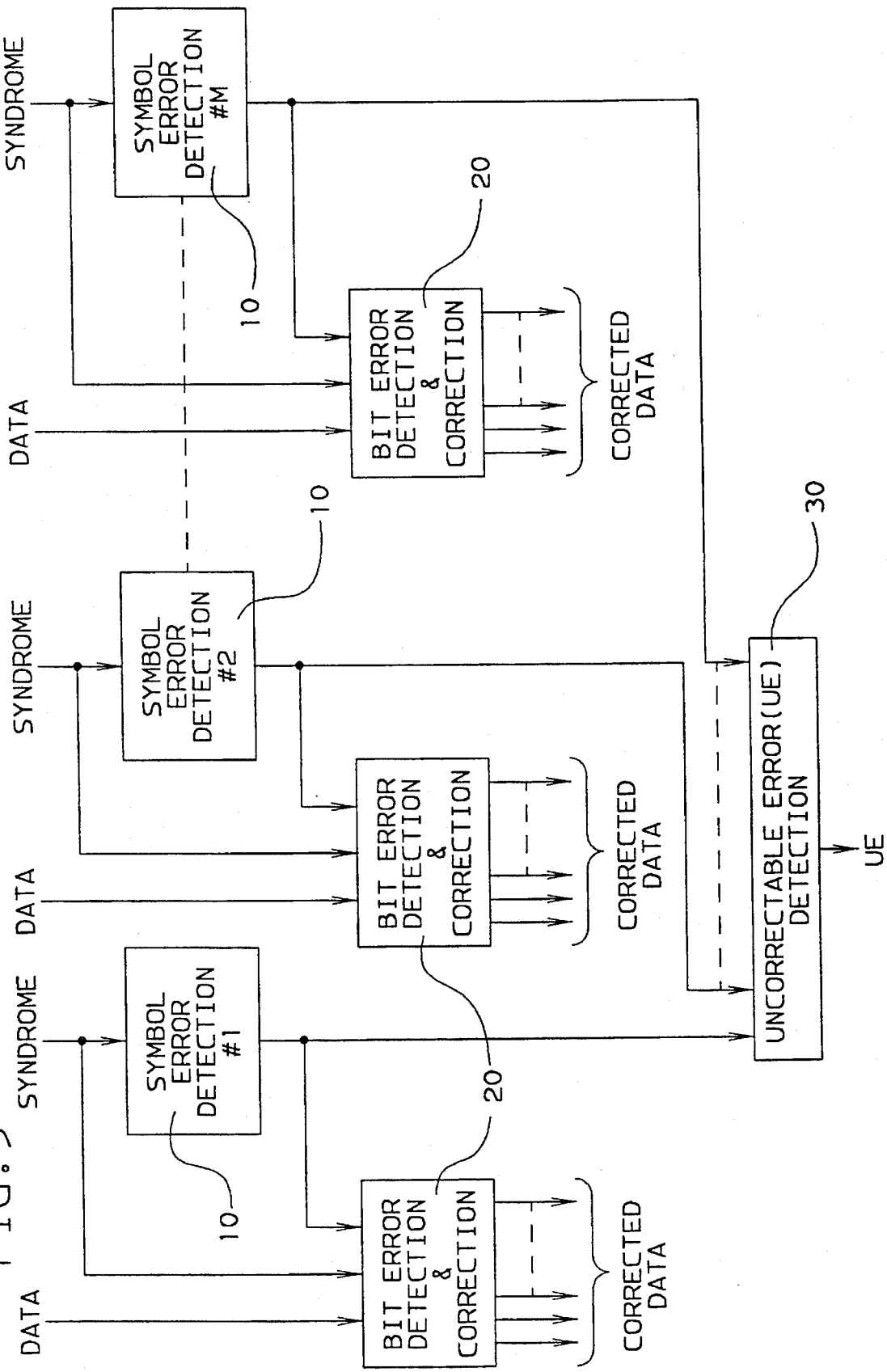
FIG. 5 is an overall block diagram of a decoding apparatus in accordance with the present invention.

The description which follows first considers the situation in which the number of check symbols in the code, M, is equal to 3. However, in the latter part of the present description, attention is directed to the general case in which M is greater than 3.

In one embodiment, the present invention is directed to a class of binary codes which have been found to be useful because of their error correction properties and because of their ease of decoding. However, the present invention improves upon these codes with respect to both encoding and decoding, particularly when measured against circuit cost as determined by the number of Exclusive-OR gates employed. The present invention is specifically directed to code construction based upon codes having a parity check matrix organized in the form of a plurality of symbol columns. Each of the symbol columns preferably includes submatrices which are powers of a given companion matrix, T, which is the matrix associated with a primitive polynomial over the Galois Field GF(2). For example, if the primitive polynomial p(x) is of degree b and has the following form:

$$p(x) = 1 + p_1 x + p_2 x^2 + \ldots + p_{b-1} x^{b-1} + x^b, \quad (2)$$

then the companion matrix T is of the form given below:

$$T = \begin{bmatrix} 0 & 0 & 0 & \ldots & 1 \\ 1 & 0 & 0 & \ldots & p_1 \\ 0 & 1 & 0 & \ldots & p_2 \\ \cdot & \cdot & \cdot & & \cdot \\ \cdot & \cdot & \cdot & & \cdot \\ \cdot & \cdot & \cdot & & \cdot \\ 0 & 0 & 0 & \ldots & p_{b-1} \end{bmatrix} \quad (3)$$

It is noted that in the mathematical field at hand the elements, namely 0 and 1, are their own additive inverses since addition is carried out in a modulo 2 fashion. This fact accounts for the absence of minus signs which would otherwise normally be present in the form given for the T matrix for other fields. Generally, the companion matrix T possesses b rows and b columns. The matrix T is also always non-singular. However, certain code simplifications and reductions, which are more particularly described below, can alter this result, at least formally, when specific binary parity check matrices are derived by column or row deletion. Appropriate parity check matrices are developed by computing the various powers of the companion matrix T and inserting such matrices in the positions shown, for example as in Equation (1) above. The result is a binary parity check matrix with specific symbol error correction properties in which each symbol is represented by at most b bits.

In one particular embodiment of the present invention, it is convenient to consider parity check matrices in which the number M of check symbols is 3. Since the submatrices, T, each generally include b rows and b columns and because of the structure of the code and the primitive nature of the polynomial p(x), there are at most $2^b - 2$ such matrices (not counting the matrix $T^0$ which is equal to the identity matrix). Thus it is useful, at least initially, to consider parity check matrices having the following form:

$$H = \begin{bmatrix} I & I & I & \ldots & I & I & 0 & 0 \\ I & T & T^2 & \ldots & T^m & 0 & I & 0 \\ I & T^{-1} & T^{-2} & \ldots & T^{-m} & 0 & 0 & I \end{bmatrix}. \quad (4)$$

In the above m (which is unrelated to M) is less than or equal to $2^b - 2$. Also in the above I represents in general, an identity matrix with b rows and b columns and the matrix O is a b×b matrix with all zero elements. The code defined by Equation (4) requires 3b binary check bits whose positions correspond to the last 3b binary columns of H (for the matrix shown). It is further noted that the matrix above is of the form $H = [H_1 \ H_2 \ \ldots \ H_N]$, where N is the number of code symbols, that is the number of blocks of b bits in a code word. In this respect, as long as each symbol is represented by b bits, the number of bits n in a code word is Nb. In the matrix H above, each of the N columns represents a binary b column matrix. These columns are referred to herein as symbol columns. Also, the weight of a binary column is the number of 1's in the column and the weight of a symbol column is the number of 1's in the b constituent binary columns of the symbol column.

One of the observations that is key to an understanding of the present invention is the fact that each symbol column $H_j$ can multiply a b×b non-singular matrix which has the effect of forming a different code by scrambling the bits in a symbol column in an invertible linear fashion. The code characteristics however are not changed. This manipulation is possible since the code is being treated as a symbol code having N separate b bit blocks. The individual b bit blocks are independently manipulable in this fashion. In fact, the manipulation of the symbol columns of H by multiplication by non-singular matrices is not dependent on the symbol columns of H having any specific form. As indicated, it is applicable to any parity check matrix for byte organized codes.

The motivation for this matrix multiplication arises from the fact that the number of two-way Exclusive-OR gates required to generate the $i^{th}$ check bit is equal to the number of 1's in the $i^{th}$ row of the binary matrix of H, less 1. Thus the total number of Exclusive-OR gates required to generate all check bits is equal to the number of 1's in the binary matrix of H, less 3b. It is thus seen that to reduce error correction coding hardware, it is desirable to reduce the number of 1's in each symbol column and in general to reduce the number of 1's in the binary matrix H itself. In general, the parity check matrices H shown in Equations (1) or (4) are not optimal in this sense.

In general, each symbol column is multiplied by all b×b non-singular binary matrices and the resulting symbol column having the lowest number of 1's is thereafter employed as the symbol column of choice. Thus, in the present invention symbol columns are employed which exhibit optimality in the sense that each symbol column possesses a minimum number of 1's. Such symbol columns and the parity check matrices comprised of such symbol columns are optimal in the sense that they exhibit minimal hardware requirements.

It is suspected, though it is not certain, that general optimization in this fashion produces symbol columns which exhibit an identity submatrix somewhere in the stack of disjoint submatrices that comprise the symbol column. However, in its most general embodiment, the present invention is not specifically limited to this requirement. Nonetheless, for purposes of decoding and for establishing error patterns, it is highly desirable to be able to construct parity check matrices with symbol columns which do include an identity submatrix. As seen below, this problem is particularly easily solved in the case of parity check matrices of the kind illustrated in Equations (1) or (4) above.

In particular, attention is now more specifically directed to optimization methods by parity check matrix modification which can be carried out on matrices of the specific form shown in Equation (4). In particular, it is seen that, apart from the first column and the last three symbol columns, each symbol column includes an identity matrix in the first matrix row and matrices of the form $T^q$ and $T^{-q}$ in the other two matrix rows. Because of the structure of the matrix T, it is in itself non-singular and maybe employed to perform the non-singular symbol column transformations indicated above. For example, it is possible to multiply symbol column #2 in the matrix from Equation (4) by either T or $T^{-1}$ to form symbol columns having either of the following structures respectively:

$$H_2 = \begin{bmatrix} T \\ T^2 \\ I \end{bmatrix}, \quad (5a)$$

or $$H_2 = \begin{bmatrix} T^{-1} \\ I \\ T^{-2} \end{bmatrix}. \quad (5b)$$

In each case it is seen that the resultant symbol column $H_2$ includes an identity matrix. Nonetheless, the three possible symbol columns $H_2$ indicated in Equations (4), (5a) and (5b) do not necessarily possess the same weight. Nonetheless, it is possible without changing code characteristics to select any one of these three possibilities as symbol column #2 for parity check matrix H. This is a key aspect to understanding the operation and effect of the present invention. In particular, the present invention provides a low cost symbol error correction coding scheme which has a minimal weight in at least one and preferably in each symbol column of its parity check matrix. It is further noted that it is not necessary to have an identity matrix as the first non-zero submatrix of a symbol column in the parity check matrix. As long as there is an identity matrix somewhere in the symbol column, the error pattern for the erroneous symbol can always be readily obtained. This observation is key to the construction of minimal weight symbol columns in the parity check matrix and a key to the construction of low cost decoding circuitry. It is also seen that the matrix structure in Equation (4) is particularly applicable to the construction of codes in which an identity matrix is always present in a symbol column.

The above discussion leads to a simple algorithm for the construction of improved parity check matrices. Such matrices produce lower cost encoders and are particularly amenable to the production of lower cost decoders especially in the situation in which an identity matrix is present in each symbol column. More particularly, for each symbol column $H_q$ of the form:

$$H_Q = \begin{bmatrix} I \\ T^q \\ T^{-q} \end{bmatrix}, \quad (6)$$

where q is an integer, the following procedure may be employed to improve the check matrix H by modification of the symbol columns. In particular, let $W_1$ be the weight of $H_Q$. Next, multiply the matrix $T^{-q}$ by the column $H_Q$ and let $W_2$ be the weight of this modified symbol column. Next, multiply the matrix $T^q$ by the symbol column $H_Q$ and let $W_3$ be its corresponding weight, that is the number of 1's in the resultant matrix. Next, the 3 weights $W_1$, $W_2$ and $W_3$ are compared. If $W_1$ is the smallest, the matrix $H_Q$ remains unchanged. If $W_2$ is the smallest, then $H_Q$ is replaced by $H_Q \cdot T^{-q}$. Similarly, if $W_3$ is the smallest weight, then the symbol column $H_Q$ is replaced by the symbol column $H_Q \cdot T^q$. It is noted that these symbol column manipulations are preferably carried out for as many symbol columns as possible. It is also noted that a symbol column substitution is not necessarily made in all instances. That is to say, $W_1$ will not always be greater than $W_2$ and $W_3$.

The above principles are illustrated in the following example in which b=5, m=14 and $p(x)=1+x^2+x^5$. In this case, the companion matrix T is given as:

$$T = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix}. \quad (7)$$

This matrix is also illustrated in FIG. 1B. The parity check matrix of Equation (4) is expressed in terms of the powers of T as shown in FIG. 1A. The matrix of all zeroes is expressed as O. The weight distribution for the 18 symbol columns of the parity check matrix H shown in FIG. 1A is computed to be (15 17 19 22 26 31 32 35 37 37 36 38 37 35 34 5 5 5). The total weight of the parity check matrix is therefore 466. Applying the weight comparison algorithm given above, an improved parity check matrix results and is shown in FIG. 2. The weight distribution for the symbol columns in this new matrix is (15 17 19 22 26 31 32 33 32 30 35 34 31 28 24 5 5 5) and the total weight of this new matrix is therefore seen to be 424 which represents a 9% reduction in weight. It is also particularly important to note that in the parity check matrix shown in FIG. 2, each symbol column includes at least one identity matrix. It is also seen that for the first 7 symbol columns no symbol column substitutions are made. This is seen to be in agreement with the comments presented above concerning the size of $W_1$ relative to $W_2$ and $W_3$.

Before considering the possibilities of achieving even further reductions, it is useful consider the matrix shown in FIG. 1C. In this particular matrix, the number of check symbols, M, is 4. This matrix and the matrix shown in Equation (1) also indicate the general mechanism for extending the results of the present invention to codes having a greater number of check symbols.

With further regard to FIG. 1A, it should also be noted that the symbol columns are indeed of the form shown in Equation (6). In particular, because of the periodic nature of the powers of T, $T^{-1}=T^{30}$, $T^{-2}=T^{29}$, $T^{-3}=T^{28}$, etc. This fact is relevant in comparing symbol column $H_Q$ with Equation (6). Similar statements are applicable to the other symbol columns.

With particular attention focused on matrix row #2 from FIG. 1A, it is seen that it is possible to extend the number of symbol columns in H by adding powers of T beyond $T^{14}$. Again, because of the periodic nature of the powers of T, it is possible to have such matrices range all the way up to $T^m$ where $m=2^b-2$. If $b=5$, $m=30$. Suppose that $H_{max}$ is a parity check matrix having the maximal number of symbol columns. This affords the opportunity for even greater reductions. In particular, in practical applications, the code length is usually less than the maximum possible value for a given code class. In particular, the number of symbols required for the code may be less than N. In this case, it is possible to select a subset of symbol columns from $H_{max}$ to form the desired parity check matrix. In order to minimize the number of Exclusive-OR gates required in a hardware coding or decoding implementation, those symbol columns are chosen which have a minimal weight. This leads to yet a new method for parity check matrix construction. In particular, the first step of this method involves the application of the matrix multiplication and weight selection algorithm described above but now with m having its maximum value $2^b-2$. Then from a modified $H_{max}$ the desired number of symbol columns are selected so as to form a subset having the smallest total weight to use as a reduced parity check matrix.

Figure 4A:
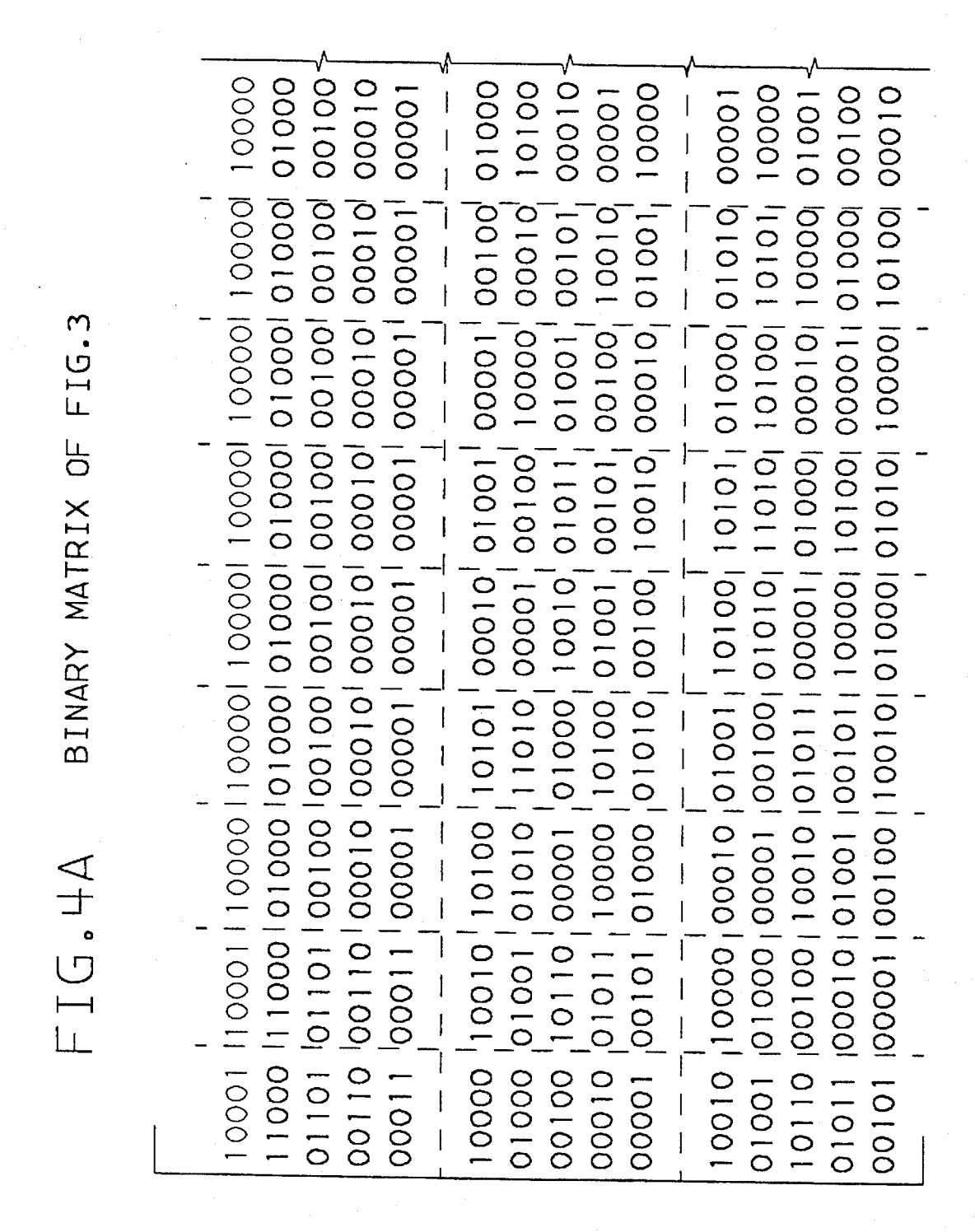

These principles can be applied to the example presented above in which $b=5$, $N=18$ and $p(x)=1+x^2+x^5$. This is the same set of parameters used in FIGS. 1A and 1B. Applying the second reduction method of the present invention (selection from the columns of $H_{max}$), an even further reduced parity check matrix is found. This matrix is shown in FIG. 3 wherein the matrix T is the same as described above. The binary form of this matrix is shown in FIG. 4 (parts A and B). The binary form of the matrix is seen below to be useful in designing decoder circuitry for receiving code words which have been subjected to the parity check conditions specified by the matrix H in FIG. 4. The total number of 1's in this matrix is 350. This now represents a 25% reduction as compared to the matrix shown in FIG. 1 which has a weight of 466.

Although the considerations provided above have generally only been directed to codes having three check symbols, the methods of the present invention can be applied to constructing a byte organized error correcting code with minimum weight symbol columns in its parity check matrix for any number of check symbols. In particular, it is seen in FIG. 1C that by multiplication by an appropriate power of T it is always possible to form a symbol column in which there is present an identity matrix. It is suspected that this is sufficient to guarantee an absolute minimum of 1's in a symbol column. In short, it is conjectured that it is only necessary to employ as non-singular multiplicand matrices, the various distinct powers of T. In general, there are $2^b-2$ such powers of T to consider. Nonetheless, in the more general case, it is possible to explore the results obtained by using all possible non-singular $b \times b$ matrices. While this problem becomes much more difficult with higher numbers of symbol bits b, the problem is nonetheless tractable when $b=3$, 4 or 5. Nonetheless, it is seen that since each symbol column can be manipulated independently of the others, the multiplication and simplification operations are nonetheless straight forward and do not grow rapidly with the number of symbol columns or with the number of check symbols.

The above described methods for symbol error correction coding in parity check matrix form may be specifically applied to the situation in which one employs 16 data symbols and 3 check symbols and wherein each symbol is represented by an 8 bit byte. The minimum of check symbols required for a symbol error correction code to correct all single symbol errors and to detect all double symbol errors is 3 check symbols. Accordingly, the code presently being considered has this detection and correction capability. For ease of implementation considerations, the parity check matrix for this code is arranged in the form $H=[M_1 \ M_2 \ I_{24}]$, where $I_{24}$ is a 24 by 24 identity matrix and $M_1$ and $M_2$ are binary matrices having forms: $M_1=[V_1 \ V_2 \ V_3]^T$ and $M_2=[V_1 \ V_3 \ V_2]^T$ where the $^T$ denotes "matrix transpose". Thus, $M_1$ and $M_2$ are in fact column matrices with submatrices $V_1$, $V_2$ and $V_3$, albeit in different row order. Note too that $M_2$ is therefore a row permutation of $M_1$. The above described methods may then be applied to construct a parity check matrix H based upon the following T matrix (here T does not represent a matrix transpose operation but rather a matrix as shown below, which should be clear from the context):

$$T = \begin{bmatrix} 0 & 0 & 0 & 0 & 0 & 0 & 0 & 1 \\ 1 & 0 & 0 & 0 & 0 & 0 & 0 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 1 \end{bmatrix}.$$

In this case, the matrix $M_1$ (which also determines $M_2$) may be specified as follows:

$$M_1 = \begin{bmatrix} V_1 \\ V_2 \\ V_3 \end{bmatrix} = \begin{bmatrix} I_8 & I_8 & I_8 & I_8 & I_8 & I_8 & I_8 & T^{50} \\ I_8 & T^1 & T^2 & T^3 & T^{252} & T^{253} & T^{254} & T^1 \\ T^{156} & T^{155} & T^{154} & T^{153} & T^{159} & T^{158} & T^{157} & I_8 \end{bmatrix}.$$

It is to be noted in the above representation for matrix $M_1$ that when one forms the sum of the powers of the submatrices in the second and third rows of $M_1$, the sum is always 156 for columns 1 through 7. This is clearly true for the first 4 subcolumns shown above for $M_1$ (note here that $I_8=T^0$). However it is noted that for matrix subcolumns 5, 6 and 7, the sum must be taken modulo 255. Thus $252+159=411=156$ (module 255). From the above representation for the matrix T, it is also seen that this particular code is based upon the primitive polynomial $p(x)=1+x+x^6+x^7+x^8$. The coefficients for this polynomial are reflected in the last column of T. This particular code is useful for providing high reliability data transfers between symbol planes and tripley modular redundant processors.

Attention is now specifically directed to the advantages of the present invention which are applicable to decoding. Certainly, it is seen that for encoders, the smaller the number of 1's in the parity check matrix the smaller will be the amount of hardware required to implement it since the number of two-way Exclusive-OR gates required with the $i^{th}$ check bit is equal to the number of 1's in the $i^{th}$ row of the binary matrix, minus one. With respect to decoders, the situation is in general not as simple. However, because of simplifications brought about by the presence of an identity matrix as one of the submatrices in each symbol column, it is possible to exploit certain code structures to provide decoders having a minimal number of Exclusive-OR gates. Furthermore, such decoders are readily designable using automated circuit layout algorithms and methods.

In particular, suppose that E is the b bit error pattern for a symbol. The positions of errors are indicated by the presence of 1's in the E vector. Suppose that the $j^{th}$ symbol of a code word contains E as the error pattern for that symbol. The error syndrome of E is equal to the product of the $j^{th}$ column of the parity check matrix H and the vector E. The syndrome S is given as Hy, where y is the received code word vector. Thus, if the code vector x is sent and the vector y is received then x=y−E (or y=x+E). However, it is known that Hy=HE because x is a code word for which Hx=0. In particular, in this situation in which there are three check symbols, the syndrome S can be partitioned into three subvectors of b bits each. This partitioning is particularly illustrated in FIG. 6A. Thus, S=(S$_1$ S$_2$ S$_3$). Suppose further that the three submatrix components of the $j^{th}$ symbol column of H are denoted by H$_{1j}$, H$_{2j}$ and H$_{3j}$. This organization is particularly illustrated in FIG. 6B for the general case where M is not necessarily equal to 3. In this case, when all the errors occur in a single symbol position, the matrix equation S=HE can be restated as three separate matrix equations as follows:

$$S_1 = H_{1j} \bar{E} \quad (8a)$$

$$S_2 = H_{2j} \bar{E} \quad (8b)$$

$$S_3 = H_{3j} \bar{E} \quad (8c)$$

In the above, S$_1$, S$_2$ and S$_3$ and $\bar{E}$ are considered as column vectors and $\bar{E}$ is the b bit error pattern for symbol j from the n bit long E vector. For each and every symbol column j one of the submatrices H$_{ij}$, i=1, 2, 3, represents an identity matrix and accordingly one of either S$_1$, S$_2$ or S$_3$ is the error pattern $\bar{E}$ for symbol j. Which one of the S$_i$ is the identity matrix depends upon j, the particular symbol column being considered. However, this is known from the structure of the original parity matrix H which is used to encode the vector which has been received. Thus, the error pattern $\bar{E}$ can be readily identified as one of the three subvector components of S. Once $\bar{E}$ has been identified, the symbol error status is determined by checking that all three congruence relations of Equation (8) are true.

For example, consider the code defined by the parity check matrix in FIGS. 3 and 4. If the errors are in the first symbol position, then the error pattern E is equal to S$_2$ since H$_{12}$ is an identity matrix in the first symbol column. To verify if the errors are really in the first symbol position, it is necessary to check that $S_1 = T^{18} \cdot S_2$ and that $S_3 = T^5 \cdot S_2$. While this computation must be carried out for each symbol column separately, it is nonetheless seen that there are relatively easy ways of carrying out the computation and the necessary comparison.

Figure 6A:
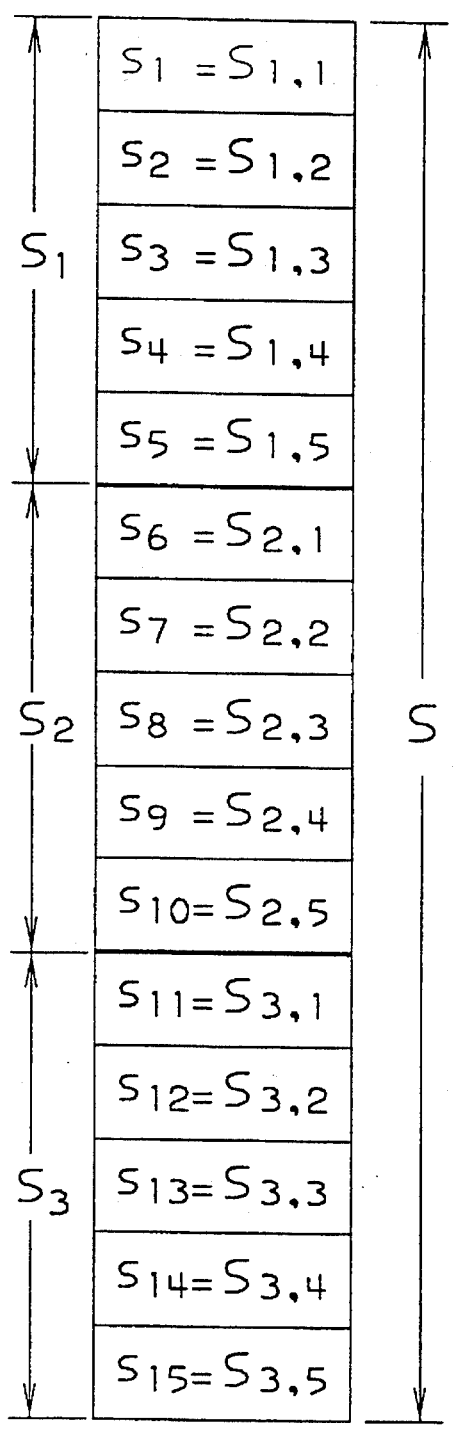
FIG. 6A illustrates the segmentation of syndrome vector S into a plurality of M subvectors, $S_i$.
Figure 6B:
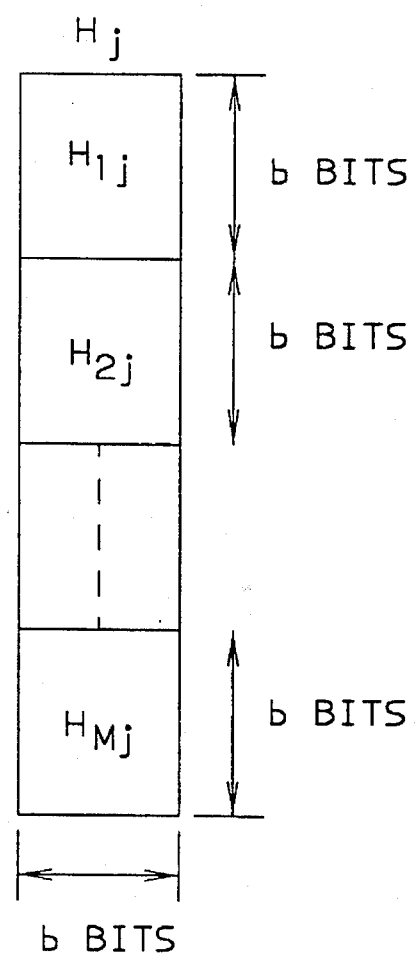
FIG. 6B illustrates the organization of the symbol columns $H_j$ of the parity check matrix H.
Figure 6D:
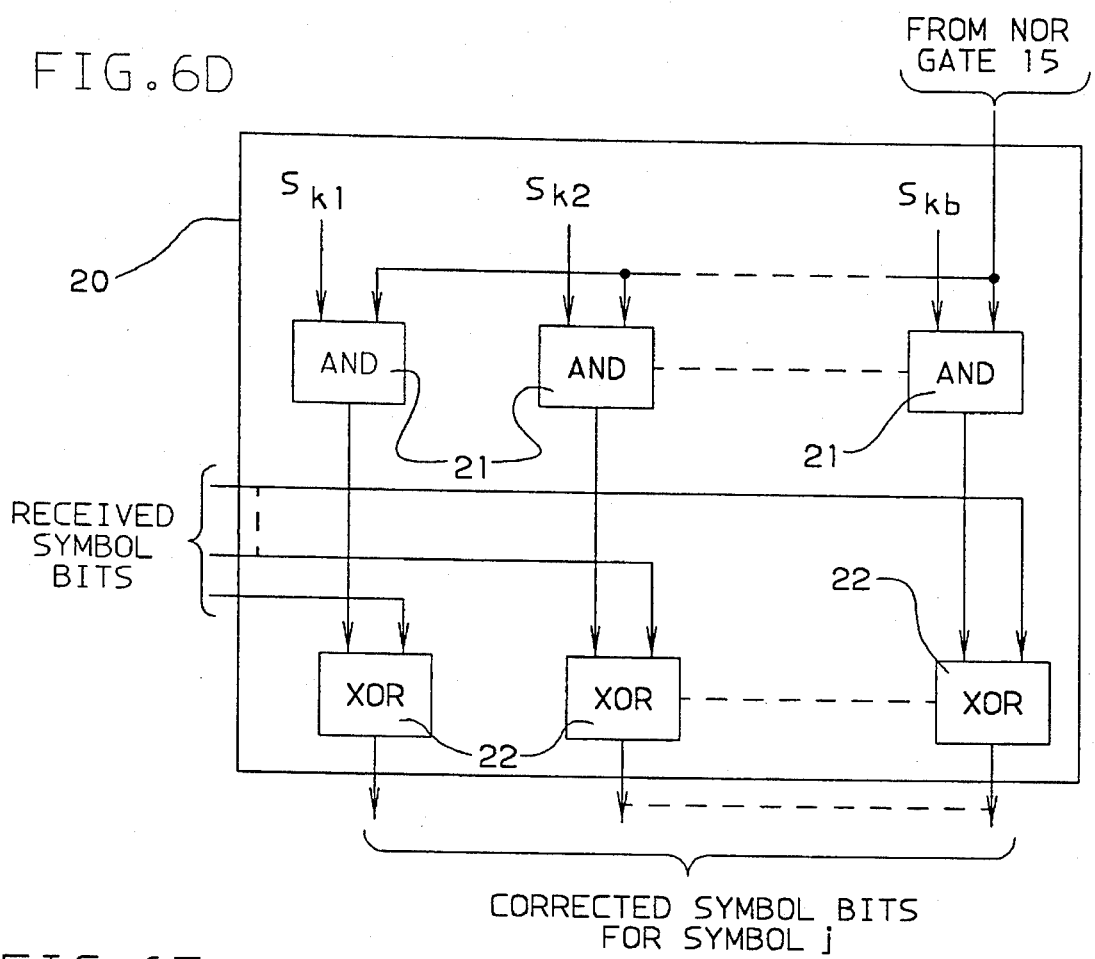
FIG. 6D illustrates the circuitry employed for correcting bits in symbol j.
Figure 6E:
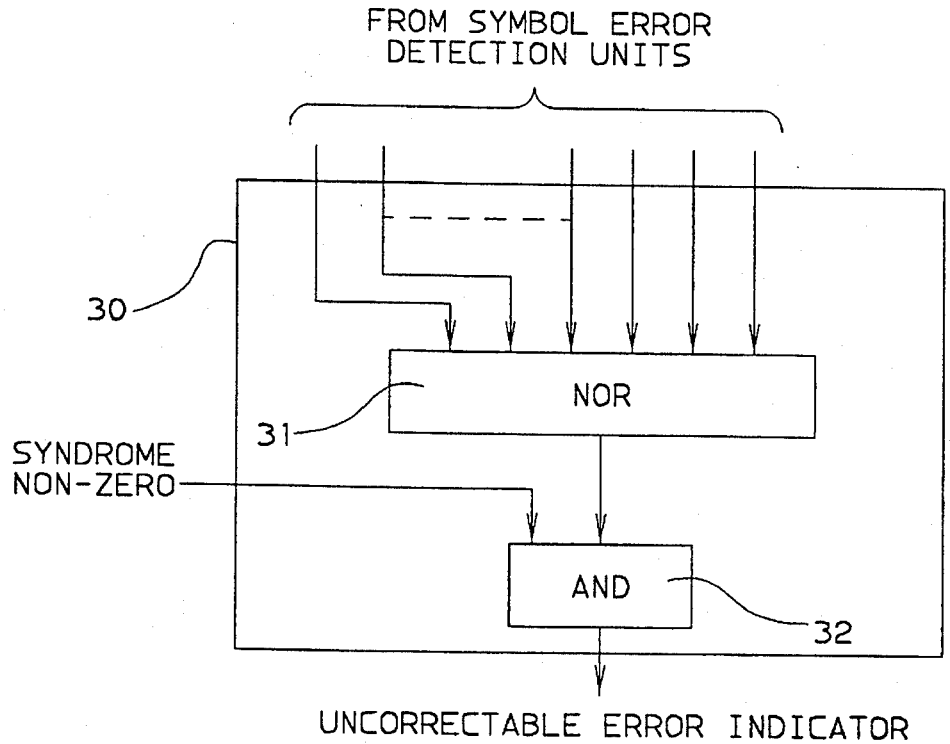
FIG. 6E illustrates the circuitry which provides uncorrectable error indications.

Attention is now specifically directed to decoding methods and apparatus for code words constructed in accordance with certain specific embodiments of the present invention. In particular, FIG. 5 illustrates an overall block diagram for error correction and detection for a symbol organized error correction code. FIGS. 6C, 6D and 6E illustrate more detailed aspects of the system shown in FIG. 5.

With respect to FIG. 5, it is noted that decoding is done separately for each symbol. Nonetheless, in general all syndrome bits are available to symbol error detection units 1 through M. Each such symbol error detection unit 10 essentially performs a binary matrix multiplication operation and a comparison operation. The output of functional block 10 is essentially an enable signal supplied to a corresponding one of the bit error detection and correction units 20. Correction units 20 receive an enable signal from a corresponding symbol error detection unit 10 and each unit 20 also receives a specific subset of syndrome data bits. In each case, the subset of syndrome bits received matches the syndrome subvector having the same relative position in the syndrome as the identity matrix has in the associated symbol column from H. Additionally, for each separate symbol, bit error detection and correction units 20 receive the symbol data bits themselves. Functional block 20 therefore typically receives b syndrome bits and b symbol data bits. Additionally, functional block 20 receives the enable signal from symbol error detection unit 10. This enable signal is also supplied to uncorrectable error detection unit 30. Each of these units is more particularly described below in the discussions relating to FIGS. 6C through 6E.

Attention is now specifically directed to symbol error detection unit 10. Such a unit is shown in more detail in FIG. 6C for the situation in which M=3. In particular, only one such unit is shown namely that unit which is associated with the $j^{th}$ symbol. In the case shown, the syndrome is partitioned into three groups of b bits each. Two matrix vector product operations are performed, one of which computes the product $H_{ij} \cdot S_k$, where i is not equal to k and where k depends on j. The other matrix product computed by unit 10 is the matrix vector product $H_{lj} \cdot S_k$, where l is not equal to k, which depends on j. It is noted that each symbol error detector 10 is associated with its own unique value of k. In particular, k is the identifier of the matrix row in the symbol column which includes the identity matrix. For the first symbol column in the parity check matrix shown in FIG. 4, k=2. For the second symbol column for this matrix, k=3. For the first symbol column j=1 and the two matrix products that are actually computed are $H_{11} \cdot S_2$ and $H_{31} \cdot S_2$. More particularly, if we also denote the syndrome vector S as (s$_1$ s$_2$ ... s$_{15}$) then symbol column multiplier 12 is actually seen to carry out the following two matrix operations given by Equations (9a) and (9b) below:

$$H_{11} \cdot S_2 = \begin{bmatrix} 1 & 0 & 0 & 0 & 1 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{bmatrix} \begin{bmatrix} s_6 \\ s_7 \\ s_8 \\ s_9 \\ s_{10} \end{bmatrix} = \begin{bmatrix} s_6 + s_{10} \\ s_6 + s_7 \\ s_7 + s_8 + s_{10} \\ s_8 + s_9 \\ s_9 + s_{10} \end{bmatrix} \quad (9a)$$

$$H_{31} \cdot S_2 = \begin{bmatrix} 1 & 0 & 0 & 1 & 0 \\ 0 & 1 & 0 & 0 & 1 \\ 1 & 0 & 1 & 1 & 0 \\ 0 & 1 & 0 & 1 & 1 \\ 0 & 0 & 1 & 0 & 1 \end{bmatrix} \begin{bmatrix} s_6 \\ s_7 \\ s_8 \\ s_9 \\ s_{10} \end{bmatrix} = \begin{bmatrix} s_6 + s_9 \\ s_7 + s_{10} \\ s_6 + s_8 + s_9 \\ s_7 + s_9 + s_{10} \\ s_8 + s_{10} \end{bmatrix} \quad (9b)$$

These last two equations, particularly when expressed in terms of Exclusive-OR or modulo 2 operations, clearly indicate that circuit complexity is directly proportional to the number of 1's in the parity check matrix. These equations also directly specify circuitry which implements the matrix products indicated. Bear in mind that Equations (9a) and (9b) represent the situation only for the matrix of FIG. 4 and for the case in which j=1 (symbol #1) for which it is seen from FIG. 4 that k=2. The two resultant vectors from Equations (9a) and (9b) are compared with subvectors $S_1$ and $S_3$ respectively. This operation is carried out by means of comparators 13 and 14 respectively as seen in FIG. 6C. However, since the field operation of addition is equivalent to an Exclusive-OR function and since a Boolean Exclusive-OR function also performs an implicit comparison upon its input variables, it is actually seen that the comparison in multiplication may in fact be carried out by means of a single layer of multi-input Exclusive-OR gates. This situation is more clearly seen in FIG. 8A which is discussed below. With respect to symbol error detection unit 10 however, the comparison results are supplied to NOR-gate 15 which provides the desired enable signal to a bit error detection and correction unit and to uncorrectable error indicator 30.

Bit error detection and correction units are more specifically illustrated in FIG. 6D. There, error pattern bits from syndrome subvector $S_k$, namely bits ($S_{k1}$ $S_{k2}$ ... $S_{kb}$) are provided to AND gates 21. AND gates 21 receive the enable signal from symbol error detection unit 10 so as to permit correction of bits for that symbol position only. Thus, the error pattern represented by syndrome subvector $S_k$ is supplied under appropriate conditions directly to Exclusive-OR gates 22. These Exclusive-OR gates receive symbol data bits which are corrected by applying the error pattern (syndrome subvector) to Exclusive-OR gates 22 which operate as conditional inverters. Thus, where necessary, received data bits are inverted in accordance with the error pattern. This is made possible by the presence of an identity matrix in each of the symbol columns of H. Thus, bit error detection and correction unit 20 operates to produced corrected symbol bits for symbol j, as shown.

Attention is next directed to uncorrectable error indicator 30 which receives enable signals from symbol error detection units 10 which are thus supplied to multiple input NOR-gate 31. The output of this NOR-gate is directed to AND gate 32 which passes this signal whenever a non-zero syndrome is detected. See FIG. 6E.

The relation between decoding hardware and the submatrices of a parity check matrix H is particularly illustrated in FIG. 8A. FIG. 8A illustrates a symbol error detection unit 10 and bit error detection and correction unit 20 for the first symbol position (j=1) associated with the parity check matrix of FIG. 4. In particular, functional block 10 of FIG. 8A implements the matrix multiplication shown above in Equations (9a) and (9b). In particular, attention is first directed to functional block 10 and Exclusive-OR gates 16.1 through 16.5 which carry out the matrix multiplication operations shown in Equation (9a). The matrix-vector multiplication operation (actually a sequence of modulo 2 summations) is carried out using the syndrome bits supplied to Exclusive-OR gates 16.1 through 16.5 which are shown having both short lead lines. The short lead lines in FIGS. 8A and 8B are thus associated with the matrix multiplication operation. Additionally, the layer of Exclusive-OR gates shown is capable of simultaneously carrying out a comparison operation because of the inherent nature of the Exclusive-OR function (namely its being the inverse of the equivalence function; NOR gate 17 complementing this inverse). Thus, in order to compare the matrix vector product $H_{11} \cdot S_2$ with the syndrome vector $S_1$ it is seen that it is only necessary to supply the syndrome subvector bit positions $s_1$ through $s_5$ to Exclusive-OR gates 16.1 through 16.5 respectively. (Be sure to distinguish $S_1$ a b bit syndrome subvector from $S_1$ the first syndrome bit.) This is shown using the longer input lead lines. Thus the multiplication and comparison operations indicated in FIG. 6C are actually performed in a single Exclusive-OR gate layer as shown. At the same time, the short lead line signals supplied through Exclusive-OR gates 16.6 through 16.10 effectively carry out the matrix multiplication indicated in Equation (9b) namely the matrix-vector product $H_{31} \cdot S_2$. This result is effectively compared with syndrome subvector $S_3$ by supplying syndrome bit positions $s_{11}$ through $s_{15}$ to Exclusive-OR gates 16.6 through 16.10 respectively. The Exclusive-OR gate outputs (gates 16.1 through 16.10) are supplied to NOR-gate 17 which provides the desired enable signal to AND gates 21.1 through 21.5 in bit error detection and correction unit 20. These AND gates also receive the error vector pattern which for symbol position 1 as represented by syndrome subvector $S_2=(s_6\ s_7\ s_8\ s_9\ s_{10})$ or using the notation shown in FIG. 6A by $S_2=(S_{21}\ S_{22}\ S_{23}\ S_{24}\ S_{25})$. The error pattern is supplied to AND gates 21.1 through 21.5 respectively which are enabled by the output from multiple input NOR-gate 17. The outputs of AND gates 21.1 through 21.5 are, as described above, supplied to Exclusive-OR gates 22.1 through 22.5 which act as conditional inverters for received data symbol bits $D_1$ through $D_5$. Thus, the output of bit error and correction unit 20 is the corrected symbol bits for symbol position No. 1. Similar decoding circuitry is provided for each of the other symbol positions. Furthermore, an uncorrectable error indication is provided through the operation of functional block 30 as shown in FIG. 6E.

Figure 7A:
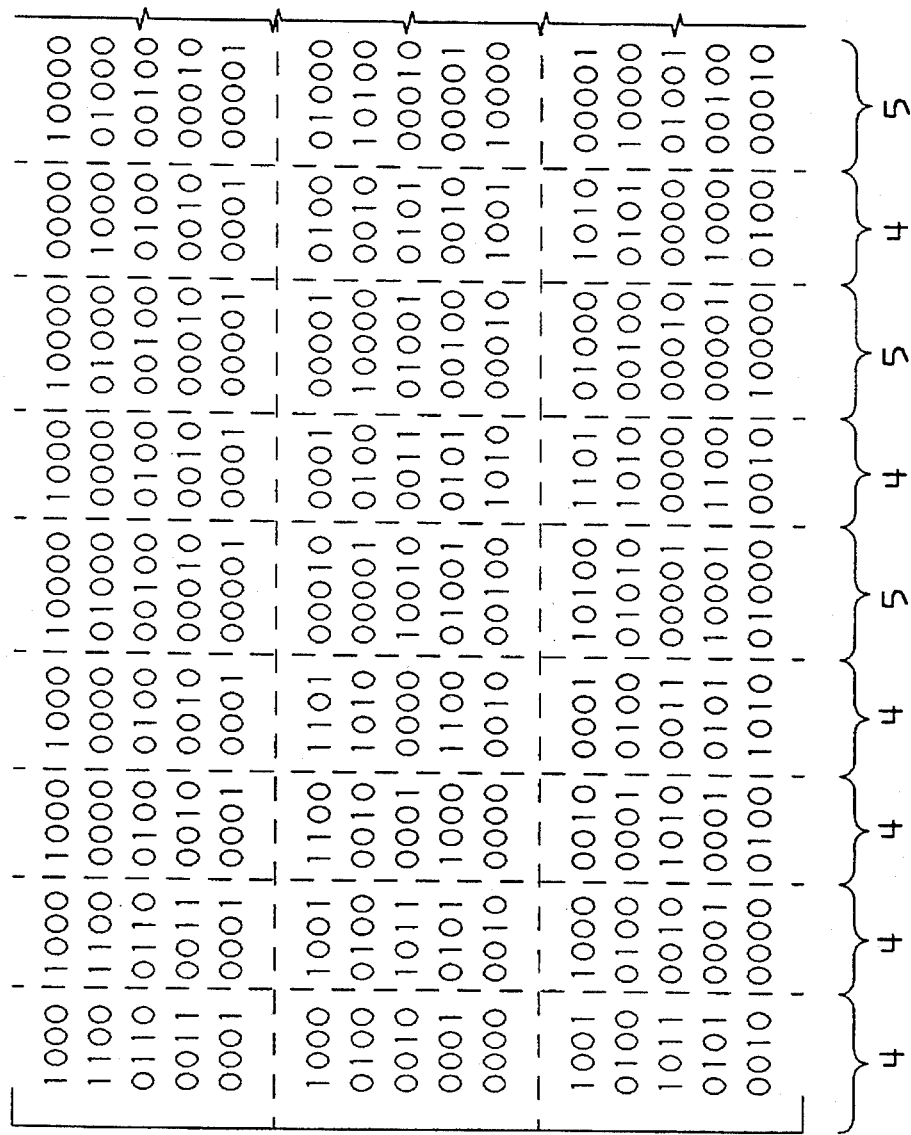
FIG. 7 (in parts A and B) is a binary check matrix which represents a column reduced form of FIG. 4.
Figure 7B:
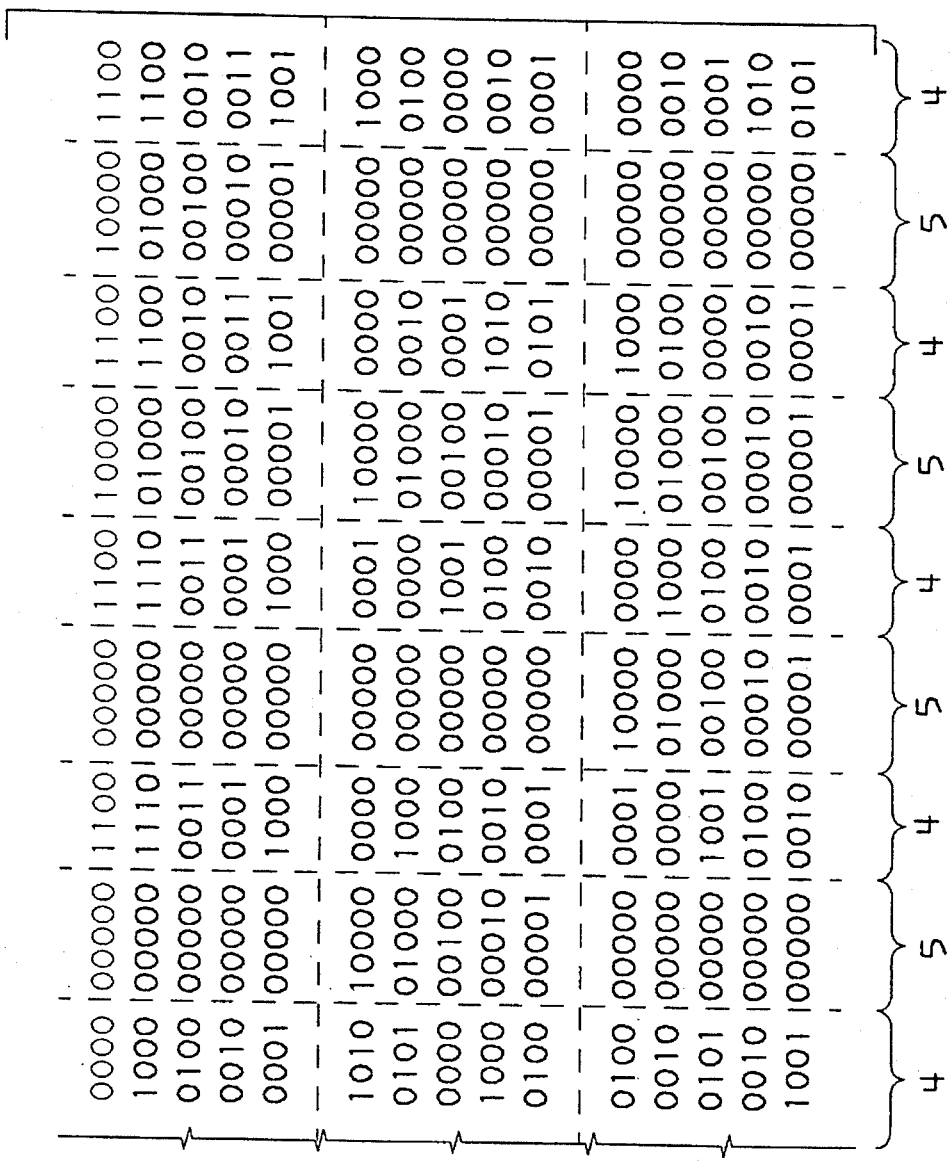

Next is considered the specific relation between the parity check matrix shown in FIG. 7 and the circuit implementation thereof illustrated in FIG. 8B. More particularly, FIG. 7 represents a modification of the binary check matrix of FIG. 4. The matrix of FIG. 4 contains 90 binary columns. However, for a particular implementation only a 79 bit code was desired which included 64 information bits and 15 check bits. This particular organization resulted from an arrangement of memory chips organized in a 9 bit per chip configuration. In each memory access it was desired to retrieve 2×79 output bits from 18 memory chips the output being split into two error correctable words each with 64 information bits. Each ECC word is therefore divided into eleven 4 bit symbols and seven 5 bit symbols (79 bit total) as suggested by the bit count along the bottom of FIG. 7. This matrix, now even further reduced, was produced by deleting one binary column from eleven of the symbol columns. The rule chosen for the deletion was to remove the binary column having the largest weight. FIG. 7 shows the resultant parity check matrix for the error correction code that is therefore designed to correct errors generated from all single chip (symbol) failures and to detect errors generated from all double chip failures. The error correction circuits for the first symbol (j=1) are shown in FIG. 8B. In particular, it is seen that additional simplifications result, most notably with respect to syndrome bit position $s_{10}$. However, other simplifications result from the elimination of other inputs to Exclusive-OR gates 16.1 through 16.10. Moreover, fewer AND gates and Exclusive-OR gates are required in bit error detection and correction unit 20.

One of the advantages of the circuitry shown in FIGS. 8A and 8B is that the matrix-vector product and comparison operations can be carried out in a single layer of Exclusive-OR gates. It is recognized however that logic designers often employ other gates to implement Exclusive-OR functions. When implemented in terms of such gates particularly when complement and true forms of input variables are not available, it is recognized that two layers of logic may be required. Nonetheless this still represents a significant advantage in computation and circuit simplification.

It is further recognized by those skilled in the art of error correction code design that it is possible to derive other codes from a given parity check matrix. As indicated above, some of these codes are obtained by deleting columns of a parity check matrix. Accordingly, the present invention is also seen to be directed to coding systems which are derivable from the parity check matrix modifications of the present invention. In this regard, it is noted that in the process of deleting binary columns, particularly as seen in the transition from FIG. 4 to FIG. 7, matrices that are otherwise identity matrices are created but may have an extra row. Nonetheless, these matrices are meant to be included in applicants' embodiments and those claims which indicate the presence of an identity submatrix in a symbol column.

Accordingly, it is seen that the present applicant has provided a method and apparatus for coding and decoding which results in low cost circuitry and improved decoding times. It is further seen that the present applicant has employed hitherto unknown techniques to manipulate and improve the performance of a large class of codes which are well known and which have highly useful error correcting properties. It is further seen that the applicant has implemented otherwise complex matrix-vector product and comparison operations in a single layer of circuitry, thus enhancing speed of operation while nonetheless providing code manipulation methods for insuring that the present codes can be implemented using minimal hardware.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for processing input digital electrical signals in the form of binary data occurring in a block of 128 bits and subblocks of at most b symbol bits, said method comprising the step of transforming by electrical circuit means said 128 bits of data to produce output digital electrical signals satisfying parity check conditions determined by a parity check matrix of the form $H=[M_1\ M_2\ I_{24}]$ where $I_{24}$ is a 24 by 24 identity matrix and $M_1$ is a matrix of the form $M_1=[V_1\ V_2\ V_3]^T$ and $M_2=[V_1\ V_2\ V_3]$ where $V_1$ is a submatrix of the form $V_1=[I_8\ I_8\ I_8\ I_8\ I_8\ I_8\ T^{50}]$, $V_2=[I_8\ T^1\ T^2\ T^3\ T^{252}\ T^{253}\ T^{254}\ T^1]$ and submatrix $V_3=[T^{156}\ T^{155}\ T^{154}\ T^{153}\ T^{159}\ T^{158}\ T^{157}\ I_8]$ and where $I_8$ is an 8 row by 8 column identity matrix and the matrix T is a companion matrix to a primitive polynomial of order 8 and where said electrical circuit means is defined by said parity check matrix.

2. The method of claim 1 in which the primitive polynomial is $p(x)=1+x+x^6+x^7+x^8$.

3. The method of claim 1 in which T is the matrix $$T = \begin{bmatrix} 0 & 0 & 0 & 0 & 0 & 0 & 0 & 1 \\ 1 & 0 & 0 & 0 & 0 & 0 & 0 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 1 \\ 0 & 0 & 0 & 0 & 0 & 0 & 1 & 1 \end{bmatrix}.$$

* * * * *